United States Patent
Alsop et al.

(10) Patent No.: US 8,704,518 B2
(45) Date of Patent: Apr. 22, 2014

(54) SYSTEM AND METHOD OF HIGH SIGNAL-TO-NOISE RATIO MAGNETIC RESONANCE IMAGING SCREENING

(75) Inventors: David C. Alsop, Newton, MA (US); Neil M. Rofsky, Dallas, TX (US); Ananth J. Madhuranthakam, Jamaica Plain, MA (US)

(73) Assignees: General Electric Company, Schenectady, NY (US); Beth Israel Deaconess Medical Center, Boston, MA (US)

( * ) Notice: Subject to any disclaimer, the term of this patent is extended or adjusted under 35 U.S.C. 154(b) by 365 days.

(21) Appl. No.: 13/087,427

(22) Filed: Apr. 15, 2011

(65) Prior Publication Data

US 2012/0262175 A1    Oct. 18, 2012

(51) Int. Cl.
*G01R 33/34* (2006.01)
*G01R 33/54* (2006.01)

(52) U.S. Cl.
USPC ............ 324/314; 324/307; 324/309; 324/322

(58) Field of Classification Search
USPC .......................................... 324/314; 600/410
See application file for complete search history.

(56) References Cited

U.S. PATENT DOCUMENTS

| | | | |
|---|---|---|---|
| 7,235,971 B2 | 6/2007 | Foxall et al. | |
| 7,627,359 B2 * | 12/2009 | Yarnykh et al. | 600/410 |
| 7,715,900 B2 * | 5/2010 | Yarnykh et al. | 600/410 |
| 2004/0181146 A1 * | 9/2004 | Yarnykh et al. | 600/419 |
| 2009/0005670 A1 * | 1/2009 | Ichinose et al. | 600/410 |

* cited by examiner

*Primary Examiner* — Melissa Koval
*Assistant Examiner* — Rishi Patel
(74) *Attorney, Agent, or Firm* — Ziolkowski Patent Solutions Group, SC

(57) ABSTRACT

An MRI apparatus is disclosed, the MRI apparatus comprising a computer programmed to apply a fluid suppression technique prior to an imaging pulse-gradient sequence, wherein the fluid suppression technique is configured to suppress signals from fluids having long longitudinal relaxation times, and apply a fat suppression technique after the fluid suppression technique and prior to the imaging pulse-gradient sequence, wherein the fat suppression technique is configured to suppress fat signals. The computer is further programmed to apply a flow suppression preparation sequence after the fat suppression technique and prior to the imaging pulse-gradient sequence, wherein the flow suppression preparation sequence is configured to suppress moving tissue signals. The computer is also programmed to apply the imaging pulse-gradient sequence, cause the RF transceiver system to acquire MR signals during the imaging pulse-gradient sequence, and reconstruct an image from the acquired MR signals.

20 Claims, 3 Drawing Sheets

SYSTEM AND METHOD OF HIGH SIGNAL-TO-NOISE RATIO MAGNETIC RESONANCE IMAGING SCREENING

BACKGROUND OF THE INVENTION

Embodiments of the invention relate generally to a system and method of whole-body magnetic resonance imaging (MRI) screening having a rapid acquisition with high signal-to-noise ratio (SNR) and minimal distortion.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals is digitized and processed to reconstruct the image using one of many well known reconstruction techniques.

Whole-body screening for metastatic tumors has long been an essential tool for the early detection and timely treatment of such oncologic lesions. Conventionally, fluorodeoxyglucose positron emission tomography (FDG-PET) scans or PET/Computed Tomography (CT) scans were the modality for conducting such metastatic tumor screening. However, due to undesirable ionizing radiation emitted during FDG-PET and PET/CT scans, the use of magnetic resonance imaging (MRI) for metastatic tumor screening has seen increased interest in recent years.

The most common sequences used for MR screening have been short-tau inversion recovery (or short-T1 inversion recovery) (STIR), diffusion-weighted echo-planar imaging (DW-EPI), or a combination of these sequences. STIR is a fat suppression technique that exploits the increased transverse relaxation time (T2) of metastatic tumors to aid in distinguishing the tumor(s) from the background signal. DW-EPI uses high diffusion gradient pulses and suitable pulse sequences to acquire an image in which areas of rapid proton diffusion are distinguished from areas of slow diffusion, which is effective in the screening of tumor metastasis due to the restricted diffusion found in metastatic tumors. Unfortunately, both STIR and DW-EPI sequences are signal-to-noise-ratio (SNR) limited, and each technique necessitates multiple signal averages in order to obtain acceptable image data. The need to obtain multiple signal averages leads to an increase in total scan time, thereby increasing the likelihood of image artifacts and a reduction in overall efficiency. Additionally, DW-EPI images are prone to distortion when used in large fields-of-view (FOV), particularly in the coronal plane, and STIR images create bright signal for fluid and blood that can confuse identification of lesions.

It would therefore be desirable to have a system and method capable of whole-body MR screening for metastatic tumors that utilizes rapid acquisition with high SNR and negligible image distortion, while also minimizing background signal (e.g., fat, fluid-filled cysts, cerebrospinal fluid, blood vessels, etc.) so as to increase metastatic tumor conspicuity.

BRIEF DESCRIPTION OF THE INVENTION

Embodiments of the invention provide an MRI apparatus comprising a MRI system having a plurality of gradient coils positioned about a bore of a magnet, and an RF transceiver system and an RF switch controlled by a pulse module to transmit RF signals to an RF coil assembly to acquire MR images. The MRI apparatus further comprises a computer programmed to apply a fluid suppression technique prior to an imaging pulse-gradient sequence, wherein the fluid suppression technique is configured to suppress signals from fluids having long longitudinal relaxation times, and apply a fat suppression technique after the fluid suppression technique and prior to the imaging pulse-gradient sequence, wherein the fat suppression technique is configured to suppress fat signals. The computer is further programmed to apply a flow suppression preparation sequence after the fat suppression technique and prior to the imaging pulse-gradient sequence, wherein the flow suppression preparation sequence is configured to suppress moving tissue signals. The computer is also programmed to apply the imaging pulse-gradient sequence, cause the RF transceiver system to acquire MR signals during the imaging pulse-gradient sequence, and reconstruct an image from the acquired MR signals.

In accordance with another aspect of the invention, a method of MRI screening is disclosed, the method comprising the steps of applying a first inversion recovery (IR) pulse before an imaging pulse-gradient sequence, applying a second IR pulse after the first IR pulse and before the imaging pulse-gradient sequence, and applying a flow suppression preparation sequence after the second IR pulse and before the imaging pulse-gradient sequence. The method further comprises the steps of applying the imaging pulse-gradient sequence, acquiring MR signals during the imaging pulse-gradient sequence, and reconstructing an image from the acquired MR signals.

In accordance with yet another aspect of the invention, a computer readable storage medium having stored thereon a computer program is disclosed, the computer program comprising instructions which when executed by a computer cause the computer to apply a first inversion recovery (IR) pulse configured to suppress signals from fluids having long longitudinal relaxation times, apply a second IR pulse after the first IR pulse, the second IR pulse configured to suppress fat signals, and apply a flow suppression preparation sequence after the second IR pulse, the flow suppression preparation sequence configured to suppress moving tissue signals. The computer program further comprises instructions which when executed by a computer cause the computer to apply an imaging pulse-gradient sequence during suppression of the signals from fluids having long longitudinal relaxation times, suppression of the fat signals, and suppression of the moving tissue signals, acquire MR signals via the imaging pulse-gradient sequence, and reconstruct an image based on the acquired MR signals.

Various other features and advantages will be made apparent from the following detailed description and the drawings.

BRIEF DESCRIPTION OF THE DRAWINGS

The drawings illustrate embodiments presently contemplated for carrying out the invention.

In the drawings.

DETAILED DESCRIPTION

A system is shown to enable whole-body magnetic resonance imaging (MRI) screening having a rapid acquisition with high signal-to-noise ratio (SNR) and minimal distortion.

Figure 1:
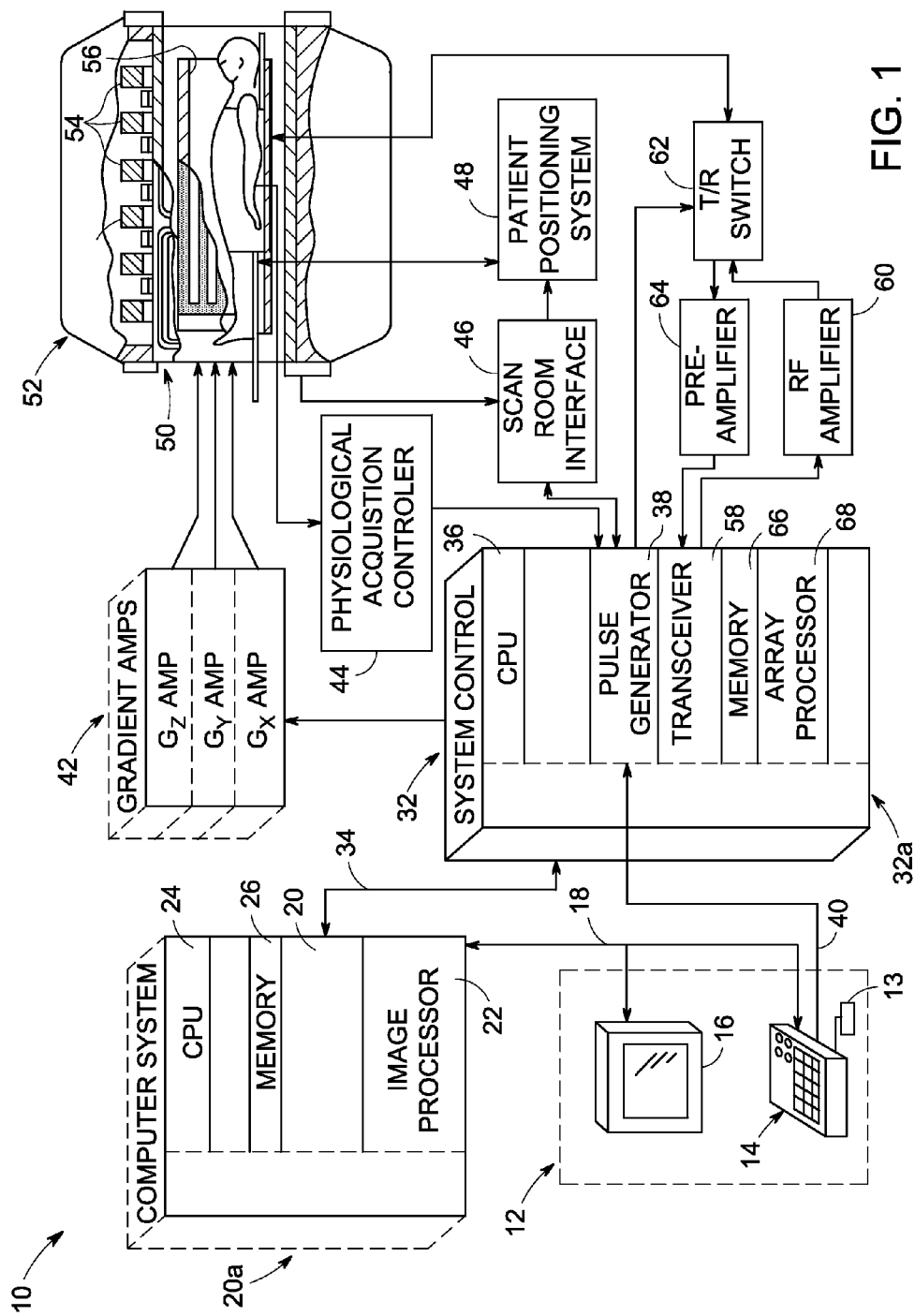
FIG. 1 is a schematic block diagram of an exemplary MR imaging system for use with an embodiment of the invention.

Referring to FIG. 1, the major components of a magnetic resonance imaging (MRI) system 10 incorporating an embodiment of the invention are shown. The operation of the system is controlled for certain functions from an operator console 12 which in this example includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These modules include an image processor module 22, a CPU module 24 and a memory module 26, known in the art as a frame buffer for storing image data arrays. The computer system 20 communicates with a separate system control 32 through a high speed serial link 34. The input device 13 can include a mouse, joystick, keyboard, track ball, touch activated screen, light wand, voice control, card reader, push-button, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 forms part of a resonance assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory. In response to commands received from the operator console 12 or as otherwise directed by the system software, this image data may be archived in long term storage or it may be further processed by the image processor 22 and conveyed to the operator console 12 and presented on the display 16.

The use of MR imaging in whole-body screening for metastatic tumors has numerous advantageous over the conventional use of FDG-PET scans or PET/CT scans, most notably the lack of ionizing radiation emitted during screening. However, the most commonly used sequences for MR screening (short-tau inversion recovery (STIR) and diffusion-weighted echo-planar imaging (DW-EPI)) are signal-to-noise ratio (SNR) limited and can be degraded by image distortion or the presence of bright signals from normal fluid or blood. Embodiments of the invention, on the other hand, provide for a whole-body MR screening method having rapid acquisition, high SNR, minimal distortion, and minimized background signal so as to increase tumor conspicuity.

Figure 2:
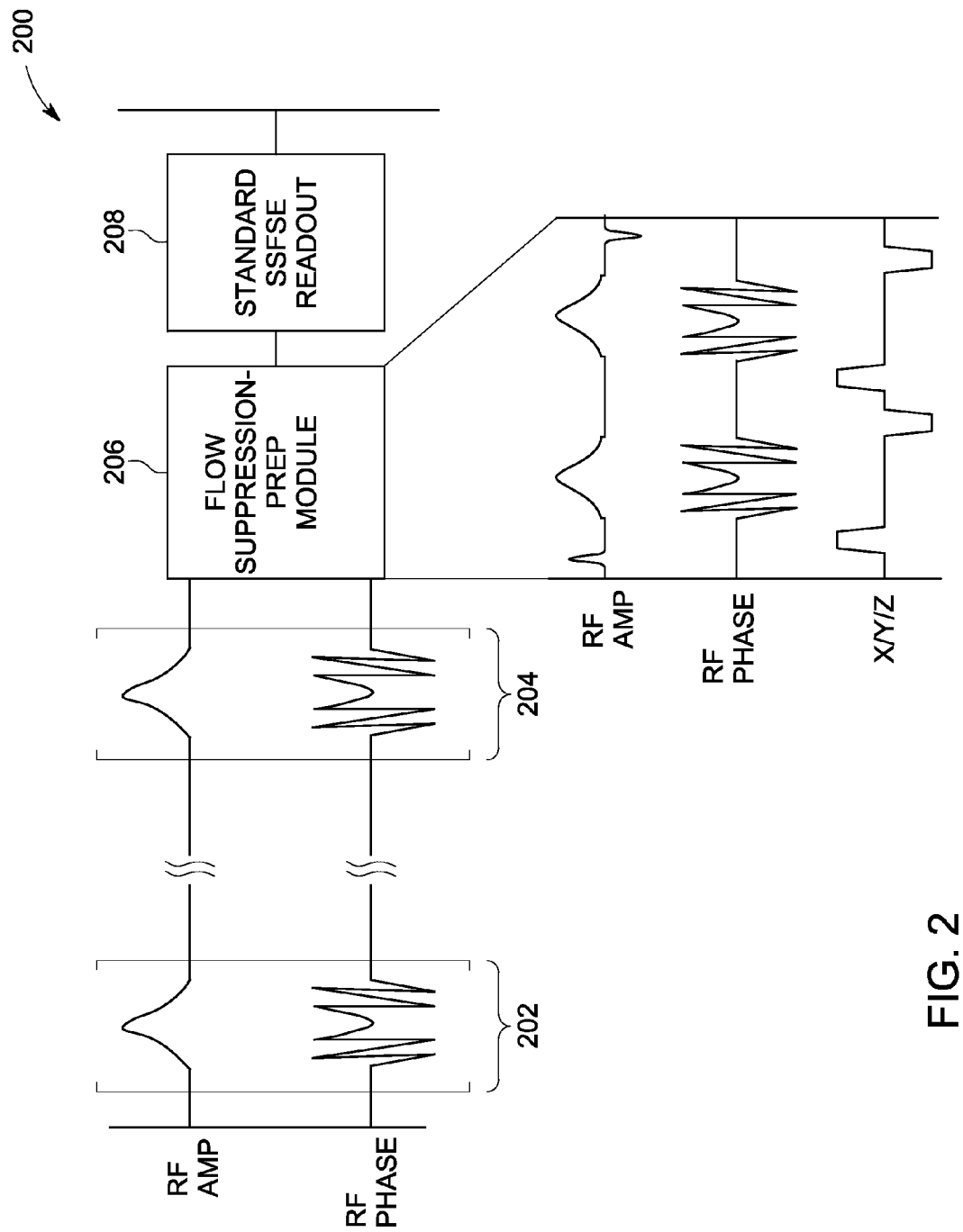
FIG. 2 is a pulse sequence diagram in accordance with an embodiment of the invention.

Referring to FIG. 2, a pulse sequence diagram 200 in accordance with an embodiment of the invention is shown. Pulse sequence diagram 200 begins with a first inversion recovery (IR) pulse 202. IR pulse 202 is designed to suppress signal from tissues having long longitudinal relaxation (or T1) properties, particularly fluids. In MR screening, such fluids may be cysts or cerebrospinal fluid (CSF). IR pulse 202 is preferably a fluid-attenuation inversion recovery (FLAIR) pulse, which is applied at a time prior to an imaging pulse-gradient sequence (e.g., SE, FSE, etc.) that is dependent upon the longitudinal relaxation properties of the fluid. When IR pulse 202 is applied, the hydrogen atoms of all tissues are flipped 180 degrees. The hydrogen atoms of the tissues then begin to return to their original (or 0 degree) position, but do so at different rates dependent upon their T1 properties. By taking advantage of this phenomenon, IR pulse 202 is designed such that it is applied at a time period corresponding to when the hydrogen atoms of the tissue that is to be suppressed (e.g., CSF) are at the halfway point of returning to their original position at the start of an imaging pulse-gradient sequence. This halfway point is otherwise known as the "null point". Signals from any atoms at this null point are unable to be collected, while signals from other tissues having different T1 properties are successfully collected via an imaging pulse-gradient sequence. Thus, IR pulse 202 acts to suppress undesired fluid signal in an MR image that may have otherwise made the visualization and diagnosis of metastatic tumors more difficult.

Pulse sequence diagram 200 also includes a second IR pulse 204. Second IR pulse 204 is configured to suppress fat signals from the MR screening image. While any fat suppression technique may be suitable, the use of a spectrally selective adiabatic inversion recovery (ASPIR or SPAIR) pulse is preferable. Like the fluid suppression enabled by first IR pulse 202, second IR pulse 204 acts to suppress undesirable fat signals by taking advantage of the known longitudinal relaxation properties and different precession frequencies of different tissues. When the spectrally selective second IR pulse 204 is applied, only the fat spins are inverted and begin to relax back to their original position according to its T1 relaxation rate, and after a certain characteristic time, the longitudinal magnetization will be zero, signifying the null point of the fat spins. If an imaging pulse-gradient sequence is applied at the moment that the fat spins have zero longitudinal magnetization, the fat spins will not contribute to the collected MR signal, thereby suppressing fat signals from the MR screening image.

Referring still to FIG. 2, pulse sequence diagram 200 further comprises Flow suppression-preparation module 206. Flow suppression-preparation module 206 may be, for example, a motion-sensitizing driven equilibrium (MSDE) sequence having weak flow suppression gradients which, when applied, suppress moving tissue such as blood. The weak flow suppression gradients introduce phase dispersion among moving spins, while maintaining the phase coherence of stationary spins, thereby spoiling the magnetization of the moving tissue (e.g., blood). Thus, when applied prior to an imaging pulse-gradient sequence, flow suppression-preparation module 206 suppresses the moving tissue from the MR screening image, which contributes to better visualization of potential metastatic tumors.

Finally, after the flow suppression-preparation module 206, pulse sequence diagram 200 comprises an imaging pulse-gradient sequence 208. Imaging pulse-gradient sequence 208 may be any suitable "readout" sequence, but is preferably a single-shot fast spin echo (SSFSE) sequence. SSFSE imaging allows for reduced acquisition times while still providing high SNR images with increased structural details as compared to other imaging sequences (e.g., echo-planar imaging (EPI)). Such high SNR and efficient acquisition is particularly advantageous in MR screening, where total scan time is preferably minimized for both artifact reduction and patient comfort.

The inclusion of first IR pulse 202, second IR pulse 204, and flow suppression-preparation module 206 prior to imaging pulse-gradient sequence 208 enables confounding tissue signal to be suppressed, thereby enhancing the visualization of metastatic tumors as compared to the remaining background signal in MR screening images. More specifically, fluids (e.g., fluid-filled cysts and CSF), fat, and blood can be simultaneously suppressed so as to enable one to more easily detect oncologic lesions. Once such lesions are identified, a more quantitative imaging method (such as diffusion-weighted imaging) may be repeated at or near the location of the detected lesions for more thorough analysis. Furthermore, the above technique may also be used to improve imaging of atherosclerotic plaque, vasculitis, and inflammatory disorders.

As previously noted, the effectiveness of inversion recovery pulses is dependent upon the T1 relaxation rate of the particular tissue(s) that is desired to be suppressed. Thus, for pulse sequence diagram 200 shown in FIG. 2, the application of first IR pulse 202 and second IR pulse 204 must be accurately timed prior to the start of imaging pulse-gradient sequence 208 to enable suppression of fluid and fat, respectively. As an example, after first IR pulse 202 is applied, an inversion time of 2700 ms at 1.5 T lapses prior to application of second IR pulse 204. Then, 130 ms after application of second IR pulse 204, flow suppression-preparation module 206 is applied, followed almost immediately (e.g., 30 ms) afterward by the start of imaging pulse-sequence gradient 208. In this way, the tissues desired to be suppressed have zero longitudinal magnetization when imaging pulse-sequence gradient 208 is applied, enabling confounding tissue signal to be suppressed while still allowing for high SNR images with minimal to no distortions.

Figure 3:
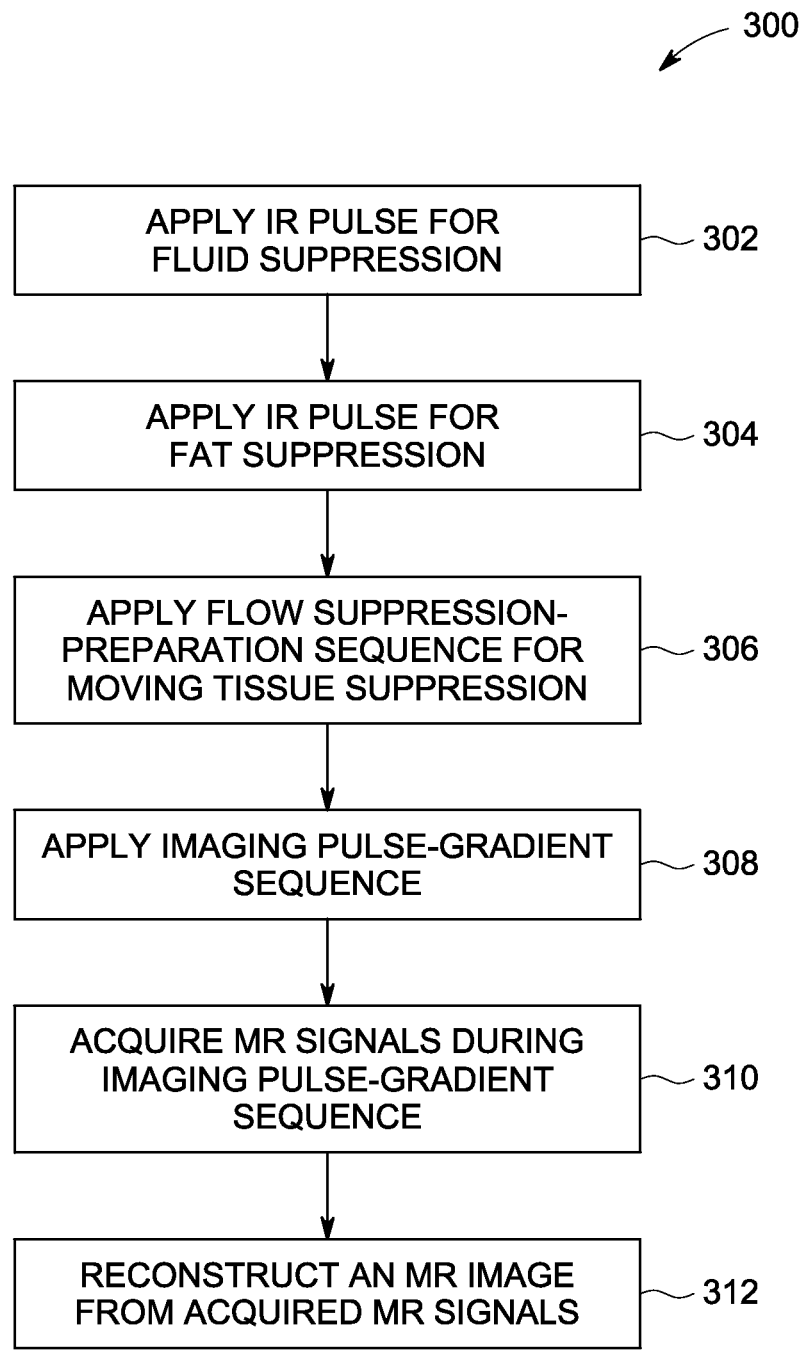
FIG. 3 is a flow chart showing an MR screening method in accordance with an embodiment of the invention.

Referring now to FIG. 3, a flowchart illustrating MR screening method 300 in accordance with an embodiment of the invention is shown. First, at block 302, an IR pulse is applied to suppress signals from fluids having long longitudinal relaxation times. At block 304, another IR pulse is applied for the purpose of suppressing fat signals. Next, at block 306, a flow suppression-preparation sequence is applied to allow for the suppression of signals from moving tissues (e.g., blood). An imaging pulse-gradient sequence is then applied at block 308. At block 310, MR signals are acquired by an RF transceiver system during the imaging pulse-gradient sequence. And finally, at block 312, an MR screening image is reconstructed from the acquired MR signals.

While the embodiment described above with respect to both FIG. 2 and FIG. 3 involves fluid and fat suppression techniques using a pair of inversion recovery pulses, such suppression is not limited to these techniques. For example, while the fluid suppression technique described above takes advantage of the long longitudinal relaxation (T1) properties of the material to be suppressed (such as cysts and CSF), it is also known that such materials have very long transverse relaxation (T2) properties. Accordingly, an alternative method for suppressing such materials involves the acquisition of two different images, one having a short echo time and the other having a long echo time. The long echo time image will predominantly contain signal from long T2 material (i.e., cysts and/or CSF). By subtracting the long echo time image from the short echo time image, the signals from tissues having long T2 properties will be suppressed in a final image. A more complex combination of these two images is also possible, such as scaling the long echo time image by a constant factor or thresholding the long echo time image before subtraction of the long echo time image from the short echo time image. As such, it is to be understood that fluid suppression is not limited to the technique described above with respect to FIG. 2 and FIG. 3, and that alternative embodiments are possible.

There are also several alternatives to suppressing fat signals in MR screening as compared to that described above with respect to FIG. 2 and FIG. 3. One alternative method of fat suppression involves applying a non-selective inversion pulse, such as a STIR pulse, prior to the application of an imaging pulse-gradient sequence. Other alternatives to fat suppression include chemically selective fat suppression (CHESS) or chemical-shift based fat/water separation methods (such as 2-point or 3-point Dixon techniques, IDEAL, etc.) or the use of a chemically selective excitation pulse as part of the imaging pulse-gradient sequence, which is commonly referred to as a spectral-spatial pulse.

In addition to alternative techniques for fluid and fat suppression described herein, there are also alternate techniques for blood (and blood vessel) suppression beyond flow suppression-preparation sequence described with respect to FIG. 2 and FIG. 3. An extension of the flow suppression-preparation sequence technique may be to apply multiple MSDE modules in rapid succession, where the motion-sensitizing gradients in each MSDE module are applied along only one direction. For example, three MSDE modules may be applied, wherein the gradients are only applied along the x-direction in the first MSDE module, along the y-direction in the second MSDE module, and along the z-direction in the third MSDE module. At the end of each of these MSDE modules, a "killer" gradient may be applied to dephase the residual transverse magnetization, thereby suppressing blood and/or blood vessels from the image. Other alternative techniques to blood/blood vessel suppression include reducing the refocusing flip angles in the fast spin echo (FSE) imaging sequence so as to attenuate blood vessels, as well as increasing crusher gradients or adding dephasing gradients within the FSE sequence so as to attenuate signal from blood vessels.

A technical contribution for the disclosed method and apparatus is that it provides for a computer implemented whole-body magnetic resonance imaging (MRI) screening method having a rapid acquisition with high signal-to-noise ratio (SNR) and minimal distortion.

One skilled in the art will appreciate that embodiments of the invention may be interfaced to and controlled by a computer readable storage medium having stored thereon a computer program. The computer readable storage medium includes a plurality of components such as one or more of electronic components, hardware components, and/or computer software components. These components may include one or more computer readable storage media that generally stores instructions such as software, firmware and/or assembly language for performing one or more portions of one or more implementations or embodiments of a sequence. These computer readable storage media are generally non-transitory and/or tangible. Examples of such a computer readable storage medium include a recordable data storage medium of a computer and/or storage device. The computer readable storage media may employ, for example, one or more of a magnetic, electrical, optical, biological, and/or atomic data storage medium. Further, such media may take the form of, for example, floppy disks, magnetic tapes, CD-ROMs, DVD-ROMs, hard disk drives, and/or electronic memory. Other forms of non-transitory and/or tangible computer readable storage media not list may be employed with embodiments of the invention.

A number of such components can be combined or divided in an implementation of a system. Further, such components may include a set and/or series of computer instructions written in or implemented with any of a number of programming languages, as will be appreciated by those skilled in the art. In addition, other forms of computer readable media such as a carrier wave may be employed to embody a computer data signal representing a sequence of instructions that when executed by one or more computers causes the one or more computers to perform one or more portions of one or more implementations or embodiments of a sequence.

Therefore, an MRI apparatus in accordance with the invention is disclosed, the MRI apparatus comprising a MRI system having a plurality of gradient coils positioned about a bore of a magnet, and an RF transceiver system and an RF switch controlled by a pulse module to transmit RF signals to an RF coil assembly to acquire MR images. The MRI apparatus further comprises a computer programmed to apply a fluid suppression technique prior to an imaging pulse-gradient sequence, wherein the fluid suppression technique is configured to suppress signals from fluids having long longitudinal relaxation times, and apply a fat suppression technique after the fluid suppression technique and prior to the imaging pulse-gradient sequence, wherein the fat suppression technique is configured to suppress fat signals. The computer is further programmed to apply a flow suppression preparation sequence after the fat suppression technique and prior to the imaging pulse-gradient sequence, wherein the flow suppression preparation sequence is configured to suppress moving tissue signals. The computer is also programmed to apply the imaging pulse-gradient sequence, cause the RF transceiver system to acquire MR signals during the imaging pulse-gradient sequence, and reconstruct an image from the acquired MR signals.

In accordance with another aspect of the invention, a method of MRI screening is disclosed, the method comprising the steps of applying a first inversion recovery (IR) pulse before an imaging pulse-gradient sequence, applying a second IR pulse after the first IR pulse and before the imaging pulse-gradient sequence, and applying a flow suppression preparation sequence after the second IR pulse and before the imaging pulse-gradient sequence. The method further comprises the steps of applying the imaging pulse-gradient sequence, acquiring MR signals during the imaging pulse-gradient sequence, and reconstructing an image from the acquired MR signals.

In accordance with yet another aspect of the invention, a computer readable storage medium having stored thereon a computer program is disclosed, the computer program comprising instructions which when executed by a computer cause the computer to apply a first inversion recovery (IR) pulse configured to suppress signals from fluids having long longitudinal relaxation times, apply a second IR pulse after the first IR pulse, the second IR pulse configured to suppress fat signals, and apply a flow suppression preparation sequence after the second IR pulse, the flow suppression preparation sequence configured to suppress moving tissue signals. The computer program further comprises instructions which when executed by a computer cause the computer to apply an imaging pulse-gradient sequence during suppression of the signals from fluids having long longitudinal relaxation times, suppression of the fat signals, and suppression of the moving tissue signals, acquire MR signals via the imaging pulse-gradient sequence, and reconstruct an image based on the acquired MR signals.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:
1. An MRI apparatus comprising:
   a magnetic resonance imaging (MRI) system having a plurality of gradient coils positioned about a bore of a magnet, and an RF transceiver system and an RF switch controlled by a pulse module to transmit RF signals to an RF coil assembly to acquire MR images; and
   a computer programmed to:
      apply a fluid suppression technique prior to an imaging pulse-gradient sequence, wherein the fluid suppres- sion technique is configured to suppress signals from fluids having long longitudinal relaxation times;

apply a fat suppression technique after the fluid suppression technique and prior to the imaging pulse-gradient sequence, wherein the fat suppression technique is configured to suppress fat signals;

apply a flow suppression preparation sequence after the fat suppression technique and prior to the imaging pulse-gradient sequence, wherein the flow suppression preparation sequence is configured to suppress moving tissue signals;

apply the imaging pulse-gradient sequence;

cause the RF transceiver system to acquire MR signals during the imaging pulse-gradient sequence; and reconstruct an image from the acquired MR signals.

2. The MRI apparatus of claim 1 wherein the fluid suppression technique comprises applying a fluid-attenuation inversion recovery (FLAIR) pulse.

3. The MRI apparatus of claim 1 wherein the fluid suppression technique comprises acquiring a first image having a short echo time and acquiring a second image having a long echo time, and further wherein the second image is subtracted from the first image to form a final image having suppressed fluid signals.

4. The MRI apparatus of claim 1 wherein the fat suppression technique comprises applying a spectral adiabatic inversion recovery (SPAIR) pulse.

5. The MRI apparatus of claim 1 wherein the fat suppression technique comprises applying a short-tau inversion recovery (STIR) pulse.

6. The MRI apparatus of claim 1 wherein the flow suppression preparation sequence is a motion-sensitized driven equilibrium (MSDE) sequence.

7. The MRI apparatus of claim 1 wherein the imaging pulse-gradient sequence is a single-shot fast spin echo (SSFSE) sequence.

8. The MRI apparatus of claim 1 wherein the fluid suppression technique is configured to suppress signals from at least one of fluid-filled cysts and cerebrospinal fluid.

9. The MRI apparatus of claim 1 wherein the flow suppression preparation sequence is configured to suppress signals from blood vessels.

10. The MRI apparatus of claim 1 wherein the computer is programmed to acquire MR signals using the imaging pulse-gradient sequence immediately after the application of the flow suppression preparation sequence.

11. A method of magnetic resonance image (MRI) screening comprising the steps of:

applying a first inversion recovery (IR) pulse before an imaging pulse-gradient sequence;

applying a second IR pulse after the first IR pulse and before the imaging pulse-gradient sequence;

applying a flow suppression preparation sequence after the second IR pulse and before the imaging pulse-gradient sequence;

applying the imaging pulse-gradient sequence;

acquiring MR signals during the imaging pulse-gradient sequence; and reconstructing an image from the acquired MR signals;

wherein the step of applying the first IR pulse comprises applying a fluid-attenuation inversion recovery (FLAIR) pulse.

12. The method of claim 11 wherein the step of applying the second IR pulse comprises applying a spectral adiabatic inversion recovery (SPAIR) pulse.

13. The method of claim 11 wherein the step of applying the flow suppression preparation sequence comprises applying a motion-sensitized driven equilibrium (MSDE) sequence.

14. The method of claim 11 wherein acquiring MR signals comprises acquiring MR signals via a single-shot fast spin echo (SSFSE) sequence.

15. A non-transitory computer readable storage medium having stored thereon a computer program comprising instructions which when executed by a computer cause the computer to:

apply a first inversion recovery (IR) pulse configured to suppress signals from fluids having long longitudinal relaxation times;

apply a second IR pulse after the first IR pulse, the second IR pulse configured to suppress fat signals;

apply a flow suppression preparation sequence after the second IR pulse, the flow suppression preparation sequence configured to suppress moving tissue signals;

apply an imaging pulse-gradient sequence during suppression of the signals from fluids having long longitudinal relaxation times, suppression of the fat signals, and suppression of the moving tissue signals;

acquire MR signals via the imaging pulse-gradient sequence; and reconstruct an image based on the acquired MR signals.

16. The non-transitory computer readable storage medium of claim 15 having further instructions to cause the computer to apply the second IR pulse 2700 ms at 1.5 T field strength after application of the first IR pulse.

17. The non-transitory computer readable storage medium of claim 15 having further instructions to cause the computer to apply the flow suppression preparation sequence 130 ms at 1.5 T field strength after application of the second IR pulse.

18. The non-transitory computer readable storage medium of claim 15 wherein the instructions cause the computer to apply a fluid-attenuation inversion recovery (FLAIR) pulse as the first IR pulse.

19. The non-transitory computer readable storage medium of claim 15 wherein the instructions cause the computer to apply a spectral adiabatic inversion recovery (SPAIR) pulse as the second IR pulse.

20. A method of magnetic resonance image (MRI) screening comprising the steps of:

applying a first inversion recovery (IR) pulse before an imaging pulse-gradient sequence;

applying a second IR pulse after the first IR pulse and before the imaging pulse-gradient sequence;

applying a flow suppression preparation sequence after the second IR pulse and before the imaging pulse-gradient sequence;

applying the imaging pulse-gradient sequence;

acquiring MR signals during the imaging pulse-gradient sequence; and reconstructing an image from the acquired MR signals;

wherein the step of applying the second IR pulse comprises applying a spectral adiabatic inversion recovery (SPAIR) pulse.

* * * * *